United States Patent

Asano et al.

[11] Patent Number: 5,804,469
[45] Date of Patent: Sep. 8, 1998

[54] SEMICONDUCTOR DEVICE AND METHOD FOR PRODUCING A SEMICONDUCTOR DEVICE

[75] Inventors: Yuichi Asano; Hitoshi Kobayashi; Katsunori Wako, all of Miyagi, Japan

[73] Assignee: Fujitsu Limited, Kawasaki, Japan

[21] Appl. No.: 839,796

[22] Filed: Apr. 18, 1997

[30] Foreign Application Priority Data

Nov. 11, 1996 [JP] Japan ................................. 8-298605

[51] Int. Cl.⁶ .................................................. H01L 21/44
[52] U.S. Cl. ........................................... 438/123; 438/122
[58] Field of Search ................................... 438/111, 112, 438/121, 122, 123

[56] References Cited

U.S. PATENT DOCUMENTS

| | | | |
|---|---|---|---|
| 3,978,578 | 9/1976 | Murphy | 438/123 |
| 5,177,032 | 1/1993 | Fogal et al. | 438/123 |
| 5,327,008 | 7/1994 | Djennas et al. | 438/123 |
| 5,378,656 | 1/1995 | Kajihara et al. | 438/123 |
| 5,384,286 | 1/1995 | Hirai | 438/122 |
| 5,394,607 | 3/1995 | Chiu et al. | 438/122 |
| 5,527,743 | 6/1996 | Variot | 438/123 |
| 5,541,447 | 7/1996 | Maejima et al. | 438/123 |

*Primary Examiner*—Kevin Picardat
*Attorney, Agent, or Firm*—Nikaido, Marmelstein, Murray & Oram LLP

[57] ABSTRACT

A method for producing a semiconductor device includes: a) an attaching process in which a flat-plate member is positioned on a flat-shape lead frame provided with a plurality of leads and a plurality of support bars so that the flat-plate member contacts at least the plurality of leads, and the flat-plate member is attached to plurality of support bars; b) an element mounting process in which a semiconductor element is mounted on the flat-plate member attached to the plurality of support bars of the flat-shape lead frame; c) a wire-bonding process in which a wire is provided between each of the plurality of leads and the semiconductor element; and d) a separating process, performed after the completion of the wire-bonding process, in which the plurality of support bars are deformed so as to separate the flat-plate member and the plurality of leads and electrically disconnect or separate the flat-plate member from the plurality of leads.

12 Claims, 13 Drawing Sheets

SEMICONDUCTOR DEVICE AND METHOD FOR PRODUCING A SEMICONDUCTOR DEVICE

BACKGROUND OF THE INVENTION

1. Field of the Invention

The present invention generally relates to semiconductor devices and methods for producing semiconductor devices, and particularly, to a semiconductor device in which a semiconductor chip (element) is bonded to a plurality of leads by wire-bonding and a method for producing such semiconductor devices.

Recently, semiconductor chips have been highly integrated and the method for producing the semiconductor chips comprises steps which require extremely fine operations. Also, according to progress in the semiconductor industry, semiconductor devices having high power have been developed. Naturally, this results in an increase in the amount of heat generated by the semiconductor devices and some semiconductor devices have a structure in which a heat spreader (heat dissipating plate) is provided in order to improve its heat dissipating ability.

On the other hand, there are demands for a semiconductor having high reliability which may be produced at a low cost. Hence, the development of a semiconductor device having properties which may respond to such various requirements is awaited.

2. Description of the Related Art

A conventional semiconductor device will be explained with reference to FIGS. 1 and 2. FIG. 1 is a diagram showing a cross-sectional view of a conventional semiconductor device 1 and FIG. 2 is a diagram showing a region of a wiring position of a semiconductor chip (element) 2 shown in FIG. 1 in a magnified scale.

As shown in FIG. 1, the semiconductor device 1 is comprised of the semiconductor chip 2, a plurality of leads 3, a heat spreader (heat dissipating plate) 4, a plurality of wires 5, adhesive tapes 6, and sealing resin (resin package) 7. The numeral 9 indicates an adhesive composition.

The semiconductor chip 2 shown in FIG. 2 is a so-called bare chip and a plurality of pads 8 are provided on the semiconductor chip 2. As mentioned above, since high integration and high power are required for the semiconductor device 1, there is a tendency to increase the number of pins formed of the semiconductor chip 2 and, accordingly, the pitch, P, shown in FIG. 2 of the pad 3 tends to be decreased.

Also, the number of leads 3 corresponds to the number of pads 8 provided with the semiconductor chip 2, and hence the number of leads 3 tends to increase. As shown in the figures, an inner lead portion 3a of the lead 3 is connected to the corresponding pad 8, which is provided with the semiconductor chip 2 by the wire 5, and an outer lead portion 3b of the lead 3, which is formed in a gullwing shape in order to make a surface mounting of the semiconductor device 1 possible, extends outside of the sealing resin 7.

The heat spreader 4 may be made of a flat-shape member having an excellent thermal conductivity and the semiconductor chip 2 is adhered to substantially the center thereof using the adhesive composition 9. Also, the inner lead portion 3a of the lead 3 is connected to the heat spreader 4 using the adhesive tape 6 which has a structure in which an adhesive composition is applied to an insulative resin film. Moreover, the sealing resin 7 is formed so as to cover at least the semiconductor chip 2 and the wire 5, and it may be formed using a technique such as a mold technique.

In the above-mentioned configuration of the semiconductor device 1, the reasons that the inner lead portion 3a is connected to the heat spreader 4 using the adhesive tape 6 are as follows.

When the wire 5 is provided between the inner lead portion 3a of the lead 3 and the corresponding pad 8 provided on the semiconductor chip 2, the above-mentioned wire-bonding is carried out and, in general, an ultrasonic bonding method is used for the wire-bonding process. On the other hand, the number of pins used has increased these days and the pitch, P, between each of the pads 3 is reduced, the area of the end portion of the inner lead portion 3a (i.e., the bonding position for the wire 5) is reduced accordingly and its mechanical strength is also decreased.

Therefore, if the wire-bonding is performed such that a space is present between the inner lead portion 3a and the heat spreader 4 (i.e., so-called space bonding), the lead 3 and the heat spreader 4 tend to contact each other and there is a danger that an electrical short is caused among a plurality of leads 3 since the heat spreader 4 is generally made of a metal having excellent thermal conductivity. For this reason, the inner lead portion 3a is connected to the heat spreader 4 using the adhesive tape 6 in order to achieve an insulation of the inner lead portion 3a and the heat spreader 4 as well as increase the mechanical strength of the inner lead portion 3a.

However, in the conventional semiconductor device having a structure in which the inner lead portion 3a is connected to the heat spreader 4 using the adhesive composition 6, there is a danger that gases are generated from the adhesive tape 6 during a cure (heat) process which is carried out after the inner lead portion 3a is connected to the heat spreader 4 and the inner lead portion 3a is damaged (corroded, for instance) by the generated gases.

In order to avoid the above problem, the lead 3 may be subjected to a washing process such as a plasma cleaning process before carrying out a wire-bonding process. However, this makes the manufacturing process of the semiconductor device complicate and the cost for producing the semiconductor device is increased.

Also, if the area of the adhesive tape 6 is reduced in order to avoid the problem, it is likely that the inner lead portion 3a is bonded to the heat spreader 4 in a state that they are not in contact with each other (i.e., the space bonding), and the electrical short may be caused among a plurality of the leads 3 which, as a result, reduces a reliability as well as yield of the semiconductor device.

SUMMARY OF THE INVENTION

It is a general object of this invention to provide a semiconductor device and a method for producing semiconductor devices in which the above-mentioned problems are eliminated.

A more specific object of the present invention is to provide a semiconductor device, in which a semiconductor chip is bonded to a plurality of leads by wire-bonding, and a method for producing such semiconductor devices, by which reliability in electrical connection of the semiconductor device may be improved at low cost.

It is another object of the present invention to provide a method for producing the semiconductor device by which reliability in electrical connection between the leads and the semiconductor element may be improved.

It is still another object of the present invention to provide a method for producing the semiconductor device by which it is possible to decrease the number of steps required for producing a semiconductor device and to reduce the cost necessary for manufacturing the semiconductor device.

The objects described above are achieved by a method for producing a semiconductor device comprising: a) an attaching process in which a flat-plate member is positioned on a flat-shape lead frame provided with a plurality of leads and a plurality of support bars so that the flat-plate member contacts to at least the plurality of leads, and the flat-plate member is attached to the plurality of support bars; b) an element mounting process in which a semiconductor element is mounted on the flat-plate member attached to a plurality of support bars of the flat-shape lead frame; c) a wire-bonding process in which a wire is bonded between each of the plurality of leads and the semiconductor element; and d) a separating process, performed after completion of the wire-bonding process, in which at least one of the plurality of support bars is deformed so as to separate the flat-plate member and the plurality of leads and electrically disconnect the flat-plate member from the plurality of leads.

According to the above method for producing a semiconductor device, when the flat-plate member is positioned on the flat-shape lead frame in a state that the flat-plate member is in contact with at least the plurality of leads in the attaching process, the flat-plate member functions as a supporting member for supporting the plurality of leads, and hence the mechanical strength of each of the plurality of leads is practically increased even if the width of the lead is narrowed due to high integration of a semiconductor device.

Also, the flat-plate member is attached to the plurality of support bars formed in the lead frame in the attaching process. In this manner, the lead frame and the flat-plate member may be integrally combined and the lead frame is electrically connected to the flat-plate member. Then, the semiconductor element may be mounted on the flat-plate member, which is connected to the lead frame, in the element mounting process.

Moreover, when the wire is provided between each of the plurality of leads and the semiconductor element in the wire-bonding process, since each of the plurality of leads is contacted and supported by the flat-plate member in the attaching process, space bonding is not performed and the wire-bonding of the leads and the semiconductor element may be positively performed. Thus, the reliability in electrical connection between the leads and the semiconductor element may be improved.

Further, each of the plurality of leads directly contacts the flat-plate member and no adhesive tape, which is usually employed in the prior art, is provided therebetween. Therefore, there is no possibility that dangerous gases are generated during a heating (curing) process which may be performed afterwards and a cleaning process of the leads, which is conventionally required, is no longer necessary. Thus, it is possible to decrease the number of steps required for producing the semiconductor device and reduce the cost necessary for manufacturing the semiconductor device.

In addition, since at least one of the plurality of support bars is deformed so as to separate the flat-plate member and the plurality of leads and electrically disconnect the flat-plate member from the plurality of leads in the separating process, there is no danger that an electrical short of the leads is generated by the flat-plate member.

The objects described above are also achieved by the method for producing a semiconductor device, wherein the flat-plate member is a heat dissipating plate having an excellent thermal conductivity.

According to the above method for producing a semiconductor device, since a heat dissipating plate having an excellent thermal conductivity is used as the flat-plate member, three different functions, namely, to function as a stage for mounting the semiconductor element, to function as a supporting member for supporting each of the leads in the wire-bonding process, and to function as a heat spreader for releasing the heat generated by the semiconductor element may be achieved by the heat dissipating plate. Thus, the size of the produced semiconductor device may be reduced compared with a semiconductor device in which these functions are achieved by separate members. Also, it is possible to be used as a package for a high-power semiconductor element which generates a larger amount of heat.

The objects described above are also achieved by the method for producing a semiconductor device, wherein the flat-plate member is made of substantially the same materials used for the flat-shape lead frame.

According to the above method for producing a semiconductor device, since the flat-plate member is made of the same materials used for the flat-shape lead frame, it is possible to process the flat-plate member employing processing devices used for processing the lead frame, and hence the efficiency of the process may be improved. Also, since the metal characteristic of the flat-plate member and that of the lead frame may become equal, it is not necessary to take into account the effect of, for instance, the difference in thermal expansion, and hence design for the flat-plate member and the lead frame may be simplified.

The objects described above are also achieved by the method for producing a semiconductor device, wherein a deformation part is formed with the plurality of support bars prior to the attaching process in order to enable a deformation operation of the plurality of support bars which is carried out in the separating process.

According to the above method for producing a semiconductor device, since a deformation part is formed with at least one of the plurality of support bars prior to the attaching process, it becomes easier to carry out the deformation operation of the support bars in the separating process, and hence the electrical disconnection of the plurality of leads from the flat-plate member may be properly performed.

The objects described above are also achieved by the method for producing a semiconductor device, wherein the deformation part is provided by forming a groove portion with at least one of the plurality of support bars.

According to the above method for producing a semiconductor device, the deformation part may be provided with at least one of the plurality of support bars by forming a groove portion, thus the operation required for the process may be very simple. Also, since the groove portion may be formed together with the lead frame, it is possible to avoid an increase in the number of manufacturing steps.

The objects described above are also achieved by the method for producing a semiconductor device, wherein an attachment of the flat-plate member to the plurality of support bars in the attaching process is carried out by using a laser welding method.

According to the above method for producing a semiconductor device, since a laser welding method is used in the attaching process, it is possible to properly perform the attachment of the flat-plate member to the plurality of support bars even if the area of attachment is very small. That is, as the number of leads is increased due to high integration of a semiconductor device, the width of each of the support bars is also narrowed and, accordingly, the area of the support bar available for attachment to the flat-plate member is reduced. It is possible, however, to perform welding of a small area by using a laser welding method, and hence the attachment of the support bar to the flat-plate member may be properly carried out.

The objects described above are achieved by a method for producing a semiconductor device comprising: a) an attaching process in which a flat-plate member is positioned on a flat-shape lead frame provided with a plurality of leads and a plurality of support bars so that the flat-plate member contacts at least the plurality of leads, and the flat-plate member is attached to the plurality of support bars; b) an element mounting process in which a semiconductor element is mounted on the flat-plate member attached to the plurality of support bars of the flat-shape lead frame; c) a wire-bonding process in which a wire is bonded between each of the plurality of leads and the semiconductor element; and d) a separating process, performed after completion of the wire-bonding process, in which the flat-plate member is deformed so as to separate the flat-plate member and the plurality of leads and electrically disconnect the flat-plate member from the plurality of leads.

According to the above method for producing a semiconductor device, when the flat-plate member is positioned on the flat-shape lead frame so that the flat-plate member contacts at least the plurality of leads in the attaching process, the flat-plate member functions as a supporting member for supporting the plurality of leads, and hence the mechanical strength of each of the plurality of leads is practically increased even if the width of the lead is narrowed due to high integration of the semiconductor device.

Also, the flat-plate member is attached to the plurality of support bars formed in the lead frame in the attaching process. In this manner, the lead frame and the flat-plate member may be integrally combined and the lead frame is electrically connected to the flat-plate member. Then, the semiconductor element may be mounted on the flat-plate member, which is connected to the lead frame, in the element mounting process.

Moreover, when the wire is provided between each of the plurality of leads and the semiconductor element in the wire-bonding process, since each of the plurality of leads is contacted and supported by the flat-plate member in the attaching process, space bonding does not occur and wire-bonding of the leads and the semiconductor element may be properly performed. Thus, reliability in the electrical connection between the leads and the semiconductor element may be improved.

Further, since each of the plurality of leads directly contacts the flat-plate member and no adhesive tape, which is usually employed in the prior art, is provided therebetween. Therefore, there is no possibility that dangerous gases are generated during a heating (curing) process which may be performed afterwards and a cleaning process of the leads, which is conventionally required, is no longer necessary. Thus, it is possible to decrease the number of steps required for producing the semiconductor device and reduce the cost necessary for manufacturing the semiconductor device.

In addition, since the flat-plate member is deformed so as to separate the flat-plate member and the plurality of leads and electrically disconnect the flat-plate member from the plurality of leads in the separating process, there is no danger that an electrical short of the leads is generated by the flat-plate member.

The objects described above are also achieved by the method for producing a semiconductor device, wherein the flat-plate member is a heat dissipating plate having an excellent thermal conductivity.

According to the above method for producing a semiconductor device, since a heat dissipating plate having an excellent thermal conductivity is used as the flat-plate member, three different functions, namely, to function as a stage for mounting the semiconductor element, to function as a supporting member for supporting each of the leads in the wire-bonding process, and to function as a heat spreader for releasing the heat generated by the semiconductor element may be achieved by the heat dissipating plate. Thus, the size of the produced semiconductor device may be reduced compared with a semiconductor device in which these functions are achieved by separated members. Also, it is possible to use it as a package for a high-power semiconductor element which generates a larger amount of heat.

The objects described above are also achieved by the method for producing a semiconductor device, wherein the flat-plate member is made of substantially the same materials used for the flat-shape lead frame.

According to the above method for producing a semiconductor device, since the flat-plate member is made of the same materials used for the flat-shape lead frame, it is possible to process the flat-plate member employing processing devices used for processing the lead frame, and hence the efficiency of the process may be improved. Also, since the metal characteristics of the flat-plate member and that of the lead frame may be the same, it is not necessary to take into account the effect of, for instance, the difference in thermal expansion, and hence design for the flat-plate member and the lead frame may be simplified.

The objects described above are also achieved by the method for producing a semiconductor device, wherein at least one deformation part is formed with the flat-plate member prior to the attaching process in order to enabling a deformation operation of the flat-plate member which is carried out in the separating process.

According to the above method for producing a semiconductor device, since at least one deformation part is formed with the flat-plate member prior to the attaching process, it is easy to carry out the deformation operation of the flat-plate member in the separating process, and hence the electrical disconnection of the plurality of leads from the flat-plate member may be properly performed.

The objects described above are also achieved by the method for producing a semiconductor device, wherein at least one deformation part is provided by forming at least one groove portion with the flat-plate member.

According to the above method for producing a semiconductor device, at least one deformation part may be provided with the flat-plate member by forming at least one groove portion, thus the operation required for the process may be very simple. Also, since the groove portion may be formed together with the flat-plate member, it is possible to avoid an increase in the number of manufacturing steps.

The objects described above are also achieved by the method for producing a semiconductor device, wherein an attachment of the flat-plate member to the plurality of support bars in the attaching process is carried out by using a laser welding method.

According to the above method for producing a semiconductor device, since a laser welding method is used in the attaching process, it is possible to properly perform the attachment of the flat-plate member to the plurality of support bars even if the area of attachment is very small. That is, as the number of leads is increased due to high integration of a semiconductor device, the width of each of the support bars is also narrowed and, accordingly, the area of the support bar available for an attachment to the flat-plate member is reduced. It is possible, however, to perform welding of a small area by using the laser welding method, and hence the attachment of the support bar to the flat-plate member may be properly carried out.

The objects described above are achieved by a semiconductor device comprising: a semiconductor element; a plurality of leads, each of which is connected to the semiconductor element by a wire; a flat-plate member on which the semiconductor element is mounted; a plurality of support bars, an end portion of which is attached to the flat-plate member; and sealing resin which seals at least the semiconductor element and the wire, wherein a space is provided between a plane in which the flat-plate member exists and a plane in which the plurality of leads are located, and the end portion of the plurality of support bars is attached to the flat-plate member so that the plurality of support bars are deformed so as to electrically disconnect the flat-plate member from the plurality of leads.

According to the above semiconductor device, since a space is provided between a plane in which the flat-plate member exists and a plane in which the plurality of leads are located, and the end portion of the plurality of support bars is attached to the flat-plate member so that the plurality of support bars are deformed so as to electrically disconnect the flat-plate member from the plurality of leads, there is no danger that an electrical short is caused among the plurality of leads due to contact with the flat-plate member.

Also, since the sealing resin is formed so as to cover the semiconductor element and the wires and present between the flat-plate member and each of the plurality of leads, the flat-plate member is electrically disconnected from each of the plurality of leads, and hence the insulation of the flat-plate member and the leads is highly reliable compared with a conventional semiconductor device in which an adhesive tape is used for the same purpose.

The objects described above are also achieved by the semiconductor device, wherein the flat-plate member is a heat dissipating plate having an excellent thermal conductivity.

According to the above semiconductor device, since a heat dissipating plate having an excellent thermal conductivity is used as the flat-plate member, three different functions, namely, a function as a stage for mounting the semiconductor element, a function as a supporting member for supporting each of the leads, and a function as a heat spreader for releasing the heat generated by the semiconductor element may be achieved by the heat dissipating plate. Thus, the size of the produced semiconductor device may be reduced compared with a semiconductor device in which these functions are achieved by separate members. Also, it is possible to use it as a package for a high-power semiconductor element which generates a larger amount of heat.

The objects described above are also achieved by the semiconductor device, wherein a deformation part, which enables ease of deformation of the plurality of support bars, is provided with a deformed portion of the plurality of support bars.

According to the above semiconductor device, since at least one deformation part is formed with the plurality of support bars, it is easy to carry out the deformation operation of the support bar, and hence the electrical disconnection of the plurality of leads from the flat-plate member of the semiconductor device may be secured.

The objects described above are also achieved by a semiconductor device comprising: a semiconductor element; a plurality of leads, each of which is connected to the semiconductor element by a wire; a flat-plate member on which the semiconductor element is mounted; a plurality of support bars, an end portion of which is attached to the flat-plate member; and sealing resin which seals at least the semiconductor element and the wire, wherein a space is provided between a plane in which the flat-plate member is located and a plane in which the plurality of leads are located, and the end portion of the plurality of support bars is attached to the flat-plate member so that at least a portion of the flat-plate member is deformed so as to electrically separate the flat-plate member from the plurality of leads.

According to the above semiconductor device, since a space is provided between a plane in which the flat-plate member exists and a plane in which the plurality of leads are located, and the end portion of the plurality of support bars is attached to the flat-plate member so that at least a portion of the flat-plate member is deformed so as to electrically disconnect the flat-plate member from the plurality of leads, there is no danger that an electrical short is caused among the plurality of leads due to the contact with the flat-plate member.

Also, since the sealing resin is formed so as to cover the semiconductor element and the wires and is present between the flat-plate member and each of the plurality of leads, the flat-plate member is electrically disconnected from each of the plurality of leads, and hence the insulation of the flat-plate member and the leads may be provided with higher reliability compared with a conventional semiconductor device in which an adhesive tape is used for the same purpose.

The objects described above are also achieved by the semiconductor device, wherein the flat-plate member is a heat dissipating plate having an excellent thermal conductivity.

According to the above semiconductor device, since a heat dissipating plate having an excellent thermal conductivity is used as the flat-plate member, three different functions, namely, a function as a stage for mounting the semiconductor element, a function as a supporting member for supporting each of the leads, and a function as a heat spreader for releasing the heat generated by the semiconductor element may be achieved by the heat dissipating plate. Thus, the size of the produced semiconductor device may be reduced compared with a semiconductor device in which these functions are achieved by separate members. Also, it is possible to use the heat dissipating plate as a package for a high-power semiconductor element which generates a larger amount of heat.

The objects described above are also achieved by the semiconductor device, wherein a deformation part, which enables ease of deformation of at least a portion of the flat-plate member, is provided with a deformed portion of at least a portion of the flat-plate member.

According to the above semiconductor device, since at least one deformation part is formed with the flat-plate member, it is easy to carry out the deformation operation of the flat-plate member, and hence the electrical disconnection of the plurality of leads from the flat-plate member of the semiconductor device may be ensured.

Other objects and further features of the present invention will be apparent from the following detailed description when read in conjunction with the accompanied drawings.

DESCRIPTION OF THE PREFERRED EMBODIMENTS

A description will be given of embodiments of a semiconductor device and a method for producing the semiconductor device according to the present invention with reference to the accompanied drawings.

Figure 3:
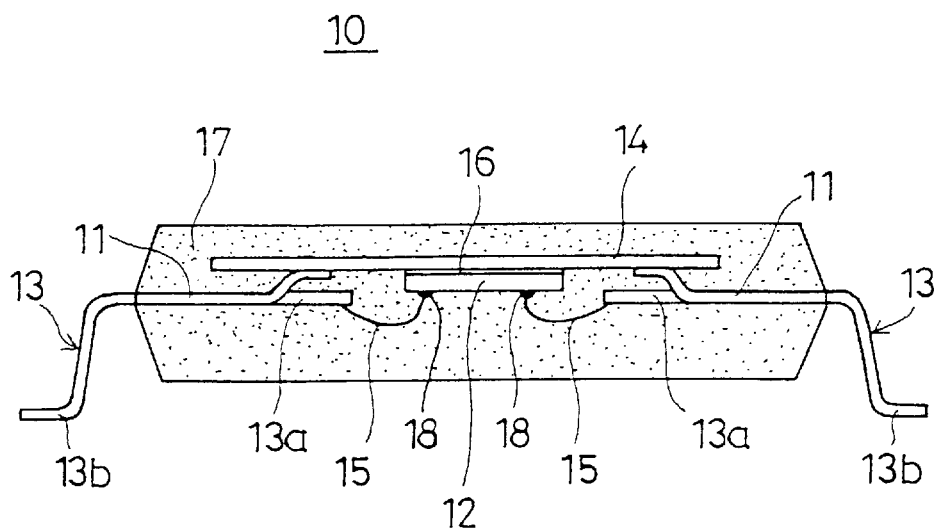
FIG. 3 is a diagram showing a cross-sectional view of a semiconductor device according to an embodiment of the present invention.

FIG. 3 is a diagram showing a cross-sectional view of a semiconductor device 10 according to an embodiment of the present invention. In FIG. 3, the semiconductor device 10 is a QFP (quad flat package) type semiconductor device which is comprised of a support bar 11, a semiconductor chip 12, a plurality of leads 13, a heat spreader (i.e., a flat-plate member which is a heat dissipating plate) 14, a plurality of wires 15, sealing resin (resin package) 17, etc.

The semiconductor chip 12 shown in FIG. 3 is a so-called bare chip and a plurality of pads 18 are provided on the surface of the semiconductor chip 12. The semiconductor device 10 according to the present invention may be highly integrated and of reduced size and, accordingly, a number of pads 18 are formed on the semiconductor chip 12 and the pitch, P, between each pad tends to be decreased.

Also, the leads 13 may be formed of a lead frame material such as copper alloy or 42 alloy. The number of leads 13 corresponds to the number of pads 18 provided with the semiconductor chip 12, and hence the number of leads 13 tend to be increased.

As shown in the figure, an inner lead portion 13a of the lead 13 is connected to the corresponding pad 18, which is provided with the semiconductor chip 12 by the wire 15, and an outer lead portion 13b of the lead 13, which is formed in a gullwing shape in order to make a surface mounting of the semiconductor device 1 possible, is extended outside of the sealing resin 17. As mentioned above, the end portion of the inner lead portion 13a is thin and its mechanical strength is not so strong.

The heat spreader 14 may be formed of a flat-shape member having an excellent thermal conductivity and the semiconductor chip 12 is fixed to substantially the center of the heat spreader 14 using an adhesive composition 16. A copper-tungsten alloy material (W-Cu) may be used for the heat spreader 14. In this connection, the thermal expansion coefficient of 20% W-Cu at 400° C. is about $5.1 \times 10^{-6}$/°C., and about 7.3 to $7.7 \times 10^{-6}$/°C. at 800° C. Its thermal conductivity is about 0.58 cal/cm sec °C. Also, the thermal expansion coefficient of 30% W-Cu at 400° C. is about $10.6 \times 10^{-6}$/°C., and about $12.0 \times 10^{-6}$/°C. at 800° C. Its thermal conductivity is about 0.67 cal/cm sec °C.

That is, the thermal conductivity of the copper-tungsten alloy material is about the same as that of the copper alloy (0.25 to 0.58 cal/cm sec °C.) which may be used as a material for the lead 13 and its heat spreading ability is superior to that of a copper alloy. Therefore, if a heating process is carried out during, for instance, a resin sealing process, in which the sealing resin (resin package) 17 is formed (to be described later), there is no danger that problems are caused due to the difference in the thermal expansion between the heat spreader 14 and the lead 13.

The support bar 11 is integrally formed with the lead 13 as a lead frame (to be described later), and is separated from the lead 13 after the resin sealing process is completed. An inner end portion of the support bar 11 is welded to the heat spreader 14.

Also, the support bar 11 is bent as shown in the figure, and hence a space is present between the plane in which the heat spreader 14 is located and the plane in which the lead 13 is present. Thus, the heat spreader 14 and each of the leads 13 are electrically disconnected and there is no danger that an electrical short is caused among the leads 13 due to contact with the heat spreader 14.

Moreover, the sealing resin 17 is formed so as to cover the semiconductor chip 12 and the wires 15, and is present between the heat spreader 14 and each of the leads 13. The sealing resin 17, which is made of an insulative resin, may be formed in a predetermined shape using a molding technique and has functions to protect the semiconductor chip 12 and the wires 15 and to electrically disconnect or separate the heat spreader 14 from each of the leads 13.

Figure 1:
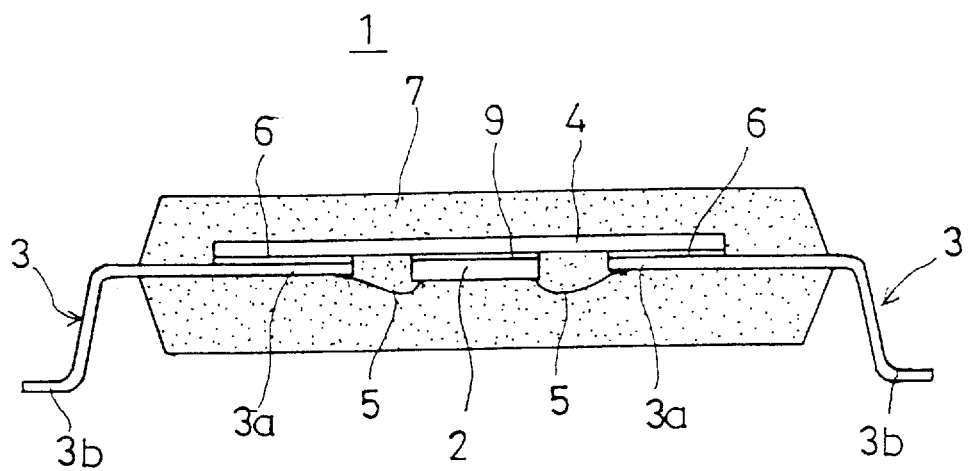
FIG. 1 is a diagram showing a cross-sectional view of a conventional semiconductor device.
Figure 2:
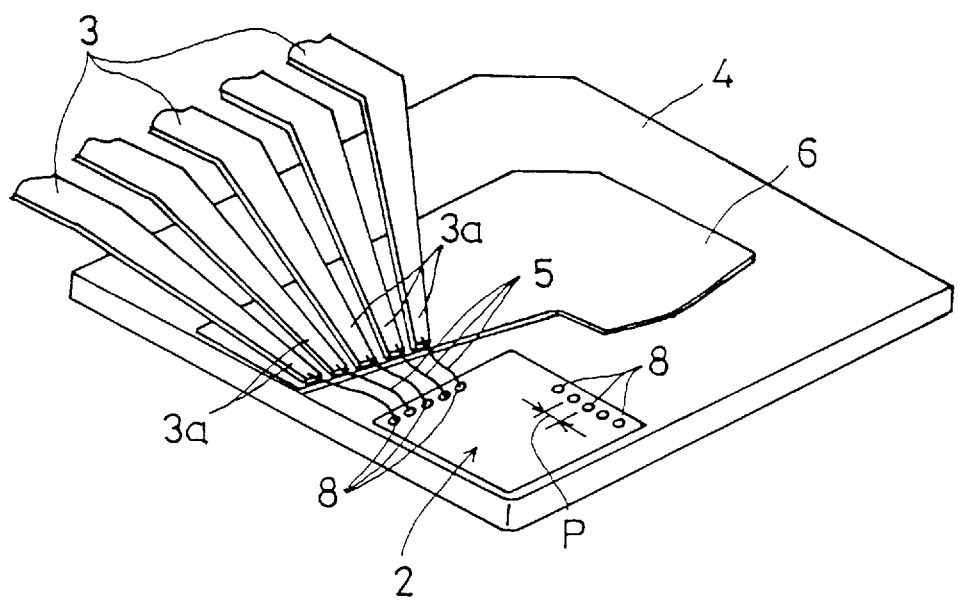
FIG. 2 is a diagram showing a region of a wiring position of a semiconductor chip shown in FIG. 1 in a magnified scale.

As mentioned above, according to the embodiment of the present invention, the heat spreader 14 and each of the leads 13 of the semiconductor device 10 are electrically disconnected or separated by the support bar 11, which is present in a space between the heat spreader 14 and the leads 13 in a bent state, and the conventional adhesive tape 6 (refer to FIGS. 1 and 2) is not employed. Therefore, the insulation of the heat spreader 14 and the leads 13 may be provided with high reliability compared with the conventional semiconductor device 1 in which the adhesive tape 6 is used for an insulation between the heat spreader 4 and each of the leads 3.

Next, a method for producing the semiconductor device 10 having the above-mentioned structure according to the present invention will be described in detail.

The method for producing the semiconductor device 10 is comprised of an attaching process, an element mounting process, a wire-bonding process, a separating process, a resin sealing process, etc.

Figure 4:
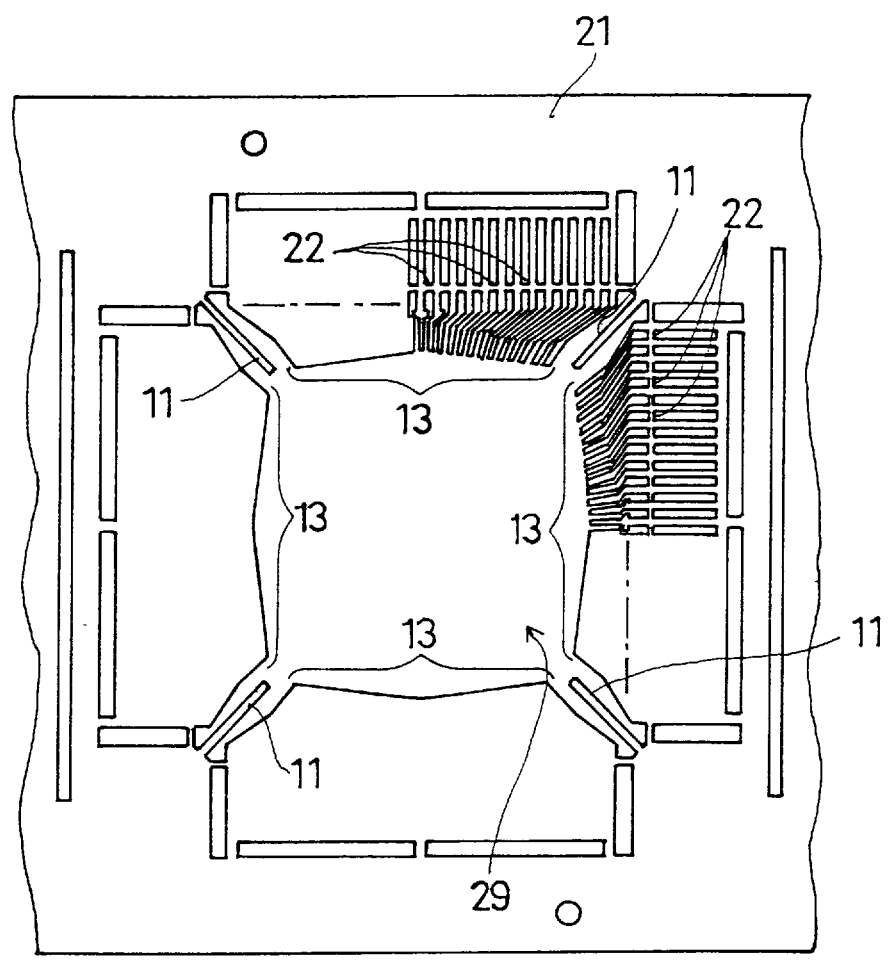
FIG. 4 is a first diagram for explaining the attaching process in the method for producing the semiconductor device according to an embodiment of the present invention.
Figure 5:
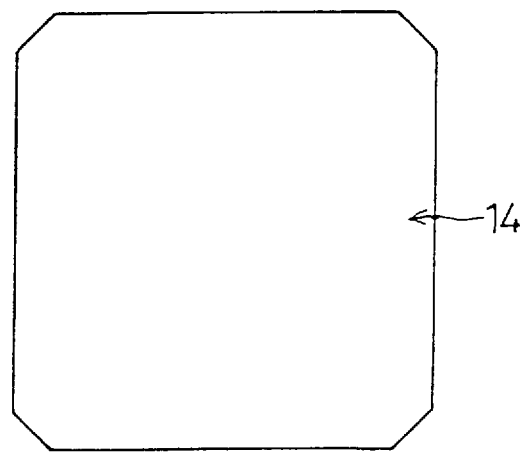
FIG. 5 is a diagram showing a heat spreader used in the attaching process.
Figure 6A:
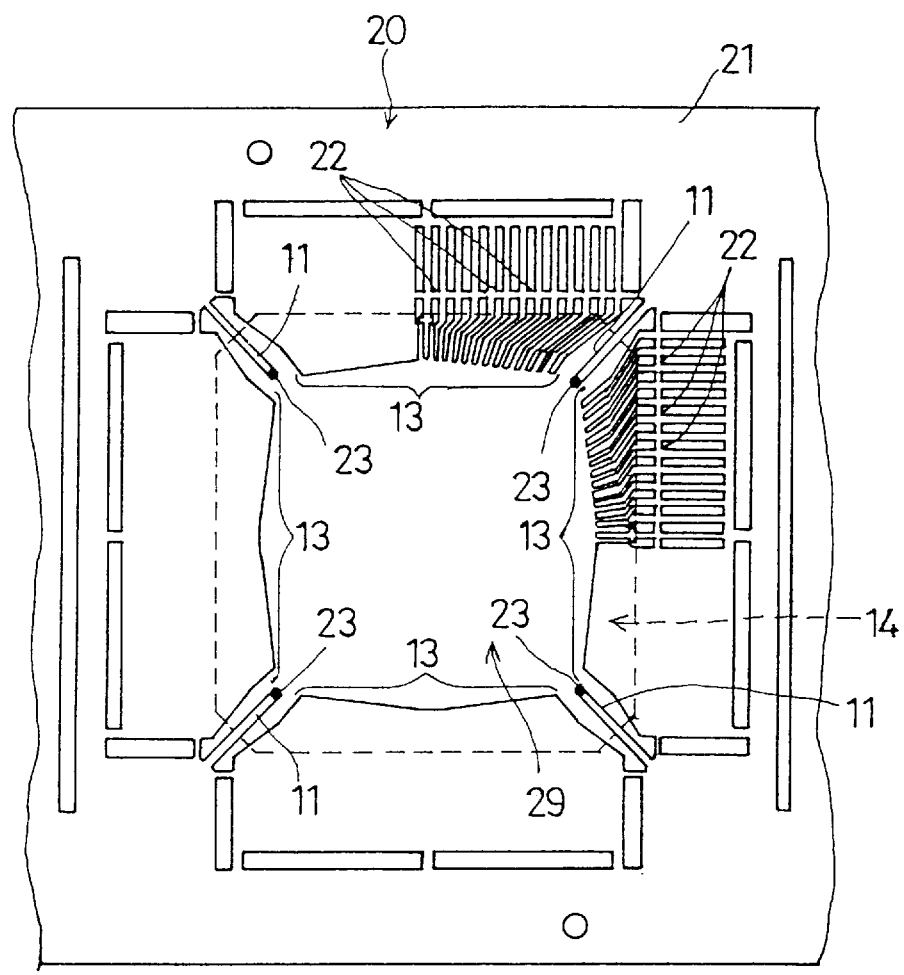
FIG. 6A is a second diagram for explaining the attaching process in the method for producing the semiconductor device according to the embodiment of the present invention.
Figure 6B:
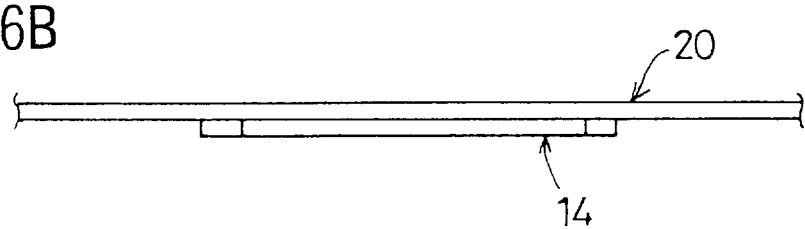
FIG. 6B is a cross-sectional diagram showing the state of a lead frame and a heat spreader in the attaching process.

Firstly, the attaching process, which is carried out prior to the element mounting process, in the method for producing the semiconductor device 10 according to the present invention will be described with reference to FIGS. 4 through 6. FIG. 4 is a diagram for explaining the attaching process according to an embodiment of the present invention and FIG. 5 is a diagram showing a heat spreader may be used in the attaching process. FIGS. 6A and 6B are also diagrams for explaining the attaching process according to an embodiment of the present invention.

In FIG. 4, a lead frame 20 used in the semiconductor device 10 is shown. The lead frame 20 is produced in a lead frame forming process which is carried out prior to the attaching process. The lead frame 20 shown in FIG. 4 may be formed in the lead frame forming process by die cutting a flat plate material.

Accordingly, the lead frame 20 has a flat shape and the support bars 11 and the plurality of leads 13 are formed in a cradle 21. The plurality of leads 13 are connected and supported by a corresponding tie bar 22 so as to extend towards an opening 29 (where the semiconductor chip 12 is mounted) which is formed in the center of the cradle 21. Also, a portion of the leads 13 which is located inside of the tie bar 22 is defined as the inner lead portion 13a, and a portion of the lead 13 which is located outside of the tie bar 22 is defined as the outer lead portion 13b.

An end portion of the inner lead portion 13a is a free end and, as mentioned above, when the pitch between each of the pads 18 formed on the semiconductor is reduced due to the increase of the number of pins, the size of the end portion of the inner lead portion 13a is also decreased and its mechanical strength decreases. Thus, the end portion of the inner lead portion 13a has a tendency to be easily deformed.

On the other hand, each of the support bars 11 is extended towards the center from the respective corner of the opening 29 and, in this embodiment, the support bars are formed in a flat shape having identical widths. The support bars 11 are located in the same plane of the leads 13 and the cradle 21 in the attaching process, and hence none of the support bars 11 is bent.

FIG. 5 is a diagram showing the heat spreader 14 according to an embodiment of the present invention. The heat spreader 14 is formed in a heat spreader forming process which is carried out prior to the attaching process. In the heat spreader forming process, a member comprised of the above-mentioned material is die cut using a mold for pressing and the heat spreader 14 shown in FIG. 5 is formed. The heat spreader 14 is a flat member having a rectangular shape and its size is set so as to be at least larger than the size of the opening 29 formed in the lead frame 20.

The heat spreader 14 having the above-mentioned structure may be positioned on the lower surface of the lead frame 20 as indicated by dotted lines shown in FIG. 6A. Since both the heat spreader 14 and the lead frame 20 have a flat shape as explained above, it is possible to position the heat spreader 14 on the lead frame 20 without having any space therebetween as shown in FIG. 6B. Thus, when the heat spreader 14 is positioned on the lead frame 20, the heat spreader 14 contacts all of the leads 13.

Also, the heat spreader 14 may function as a supporting member for supporting the leads 13 when the leads 13 are in contact with the heat spreader 14. Thus, even if the end portion of each of the leads 13 is very thin due to a high integration of the semiconductor device 10, it is possible to practically improve its mechanical strength.

When the heat spreader 14 is positioned on the lead frame 20 as explained above, the end portion of each of the support bars 11 formed with the lead frame 20 is attached to the heat spreader 14. In FIG. 6A, the numeral 23 indicates the attachment position of the support bar 11 and the heat spreader 14.

According to this embodiment of the present invention, a laser welding method is used to attach each of the support bars 11 to the heat spreader 14. Since a laser beam is used for carrying out the attachment in the laser welding method, it is possible to perform the attachment in a smaller area, compared with other conventional welding method.

It is necessary to minimize the size of each of the support bars 11 in accordance with the increase in the number of the leads 13 as mentioned above, and the width of each of the support bars 11 is relatively narrowed. The laser welding method is capable of properly performing attachment of the heat spreader 11 to each of the support bars 11 having such a narrow width.

Also, when the heat spreader 14 is positioned to the lead frame 20 as mentioned above and each of the support bars 11 is attached to the heat spreader 14, the heat spreader 14 and the lead frame 20 may be integrally combined, and hence they are electrically connected.

When the above-mentioned attaching process is completed, the element mounting process is carried out as follows. In the element mounting process, the semiconductor chip 12 is mounted on the heat spreader 14 which has been attached to the lead frame 20. At this stage, the semiconductor chip 12 is fixed to the heat spreader 14 using the adhesive composition 16 so that the semiconductor chip 12 may be located substantially in the center of the opening 29 formed in the lead frame 20.

Figure 7:
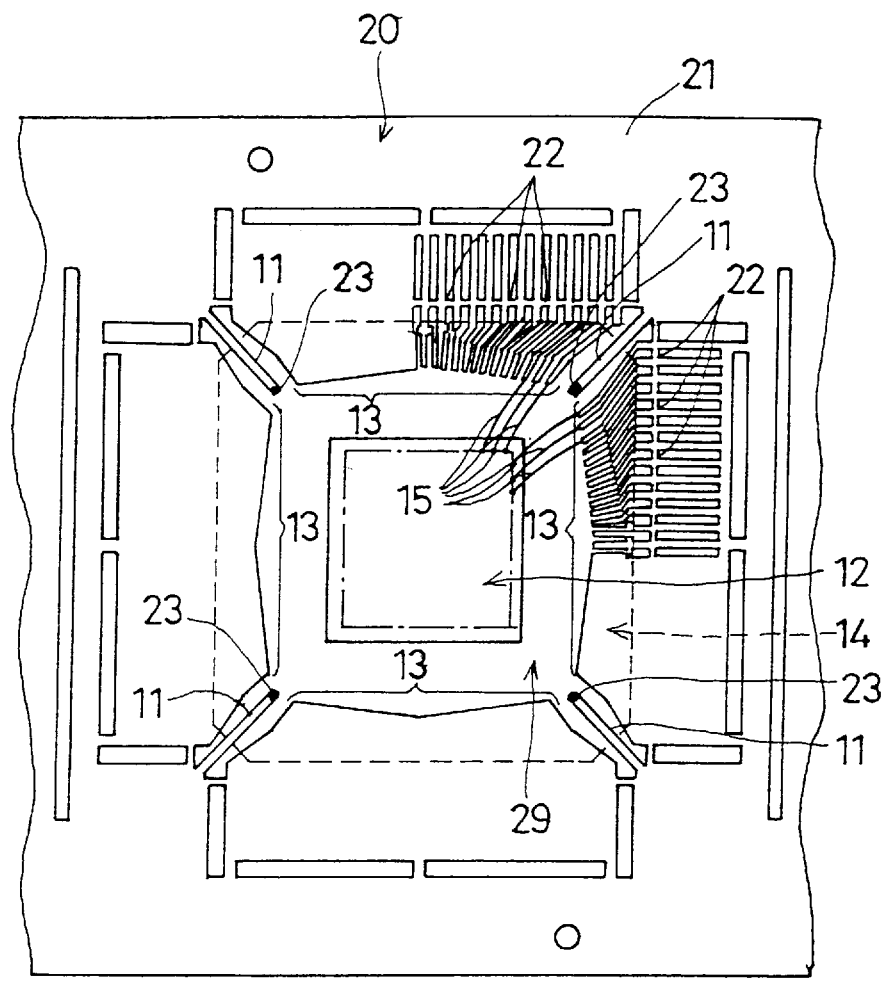
FIG. 7 is a first diagram for explaining a wire-bonding process in the method for producing the semiconductor device according to the embodiment of the present invention.
Figure 8:
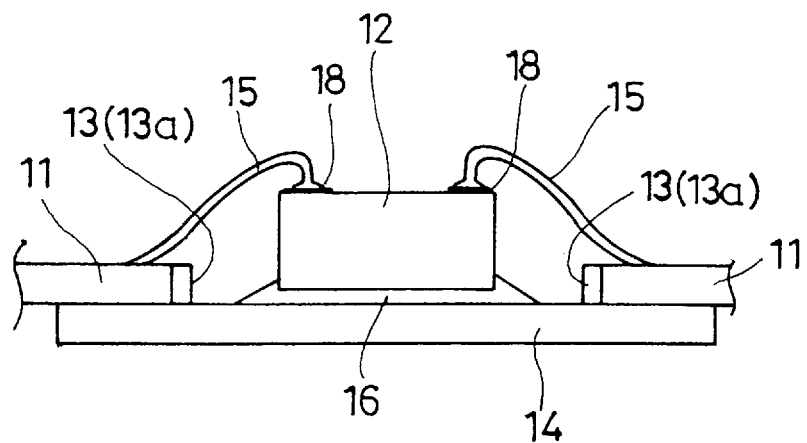
FIG. 8 is a second diagram for explaining the wire-bonding process in the method for producing the semiconductor device according to the embodiment of the present invention.

After the semiconductor chip 12 is mounted on the heat spreader 14 in the element mounting process as mentioned above, the wire-bonding process is performed. FIG. 7 is a first diagram for explaining the wire-bonding process in the method for producing the semiconductor device according to the embodiment of the present invention and FIG. 8 is a second diagram for explaining the wire-bonding process in the method for producing the semiconductor device according to the embodiment of the present invention. In FIG. 8, a region of the semiconductor chip 12 after the wire bonding-process is shown in a magnified scale.

In the wire-bonding process, the wire 15 is provided between each of the pads 18 formed on the semiconductor chip 12 and a corresponding lead 13. The bonding of the wire 15 with the pad 18 or with the lead 13 is carried out by using an ultrasonic bonding method in which capillaries (not show) are employed.

The ultrasonic bonding method is a method in which the generated ultrasonic vibration energy is applied to a bonding location or position. Thus, if the bonding location or position is moved or movable during the process, the ultrasonic vibration may be dispersed and the bonding cannot be properly performed. Especially, the end portion of the lead 3 is very thin and easily deformed as mentioned above, and hence there is a danger that the wire-bonding of the end portion may not be properly performed. This may lead to space bonding as mentioned above.

However, according to the embodiment of the present invention, each of the leads 13 is connected and supported by the heat spreader 14 in the attaching process which takes place before the wire-bonding process as explained above. Therefore, the end portion of each of the leads 13 does not move during the wire-bonding process, and hence it is possible to properly perform the bonding of the wire 15 to each of the leads 13. Accordingly, the electrical connection between the semiconductor chip 12 and each of the leads 13 is secured and the reliability of the semiconductor device 10 may be improved.

Also, each of the leads 13 directly contacts the heat spreader 14 as mentioned above, and unlike the conventional methods, no adhesive tapes are present between the plurality of leads 13 and the heat spreader 14. Thus, there is no possibility that gases are produced due to the adhesive tape during a heat (cure) process that may be performed after the wire-bonding process, and hence a cleaning process of the leads 13, which is conventionally required, is no longer necessary. For this reason, it is possible to decrease the number of steps required for producing the semiconductor device and reduce the cost necessary for manufacturing the semiconductor device.

When the above-mentioned wire-bonding process is finished and the wire 15 is provided between each of the leads 13 and the semiconductor chip 12, the separating process takes place. Prior to the practice of the separating process, the lead frame 20 having the plurality of leads 13 and the support bars 11 is in direct contact with the heat spreader 14 as shown in FIGS. 6B and 8 and electrically connected to the heat spreader 14.

In the separating process, each of the leads 13 is electrically disconnected or separated from the heat spreader 14 by deforming the support bars 11 or the heat spreader 14 so as to separate each of the plurality of leads 13 from the heat spreader 14.

Although the present invention will be explained with a case in which the support bars 11 are deformed hereinafter, it is possible to deform the heat spreader 14 instead of the support bars 11. Also, according to this embodiment of the present invention, the process for electrically disconnecting or separating each of the leads 13 from the heat spreader 14 is carried out after the resin forming process in which the sealing resin 17 is formed.

Figure 9:
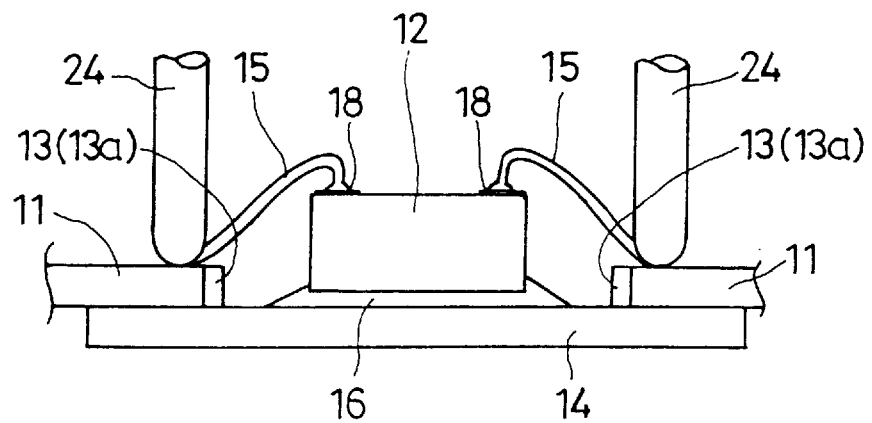
FIG. 9 is a first diagram for explaining a separating process in the method for producing the semiconductor device according to the embodiment of the present invention.
Figure 10:
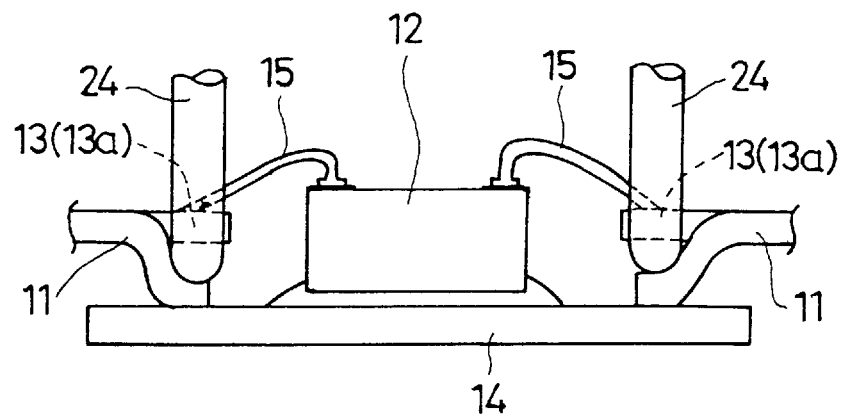
FIG. 10 is a second diagram for explaining the separating process in the method for producing the semiconductor device according to the embodiment of the present invention.
Figure 11:
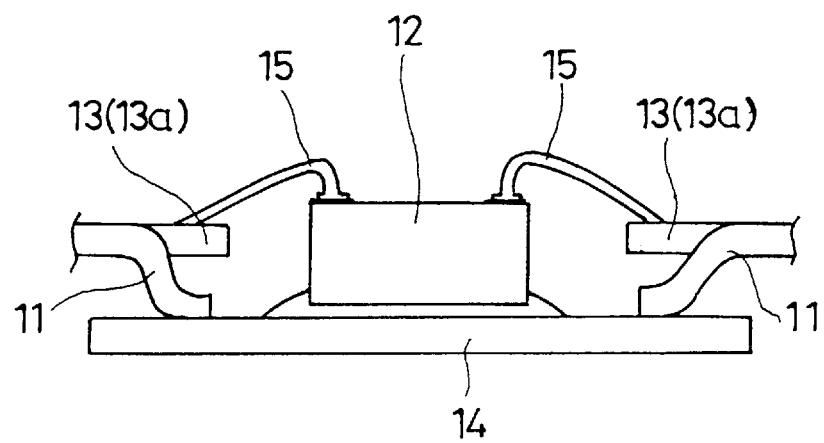
FIG. 11 is a third diagram for explaining the separating process in the method for producing the semiconductor device according to the embodiment of the present invention.

FIGS. 9 through 11 are diagrams for explaining the separating process in which the support bars 11 are deformed according to the embodiment of the present invention. As shown in FIG. 9, in order to perform the deformation of the support bars 11, a deformation tool 24, which is connected to a pressing apparatus, is first placed on the upper portion of each of the support bars 11. The position of the deformation tool 24 is determined so as to be matched to, for instance, a bonding position 23 of the heat spreader 14 and each of the support bars 11.

Then, the pressing apparatus is actuated so that each deformation tool 24 is moved downward. At this time, the position of the lead frame 20 is controlled by a fixing member (not shown). Thus, when the deformation tool 24 is moved downward, each of the support bars 11 is deformed as shown in FIG. 10.

Also, according to the deformation of the support bars 11, the heat spreader 14 which is welded to the support bars 11 is also moved downward, and hence the heat spreader 14 is separated from the lead frame 20. When the support bars 11 are deformed and the heat spreader 14 is separated from the lead frame 20, each of the deformation tool 24 is moved upward by the pressing apparatus and the tool 24 is detached from the corresponding support bar 11 as shown in FIG. 11.

After this step, the support bars 11 and the leads 13 are cut from the cradle 21 of the lead frame 20 and the tie bars 22 are also separated. Thus, each of the support bars 11 and the leads 13 are electrically disconnected or separated. According to this embodiment of the present invention, however, the resin sealing process in which the sealing resin 17 is formed is performed before electrically disconnecting the support bars 11 and the leads 13.

The reason for the above is that another tool for supporting the support bars 11 and the leads 13 is required during the resin sealing process if the support bars 11 and the leads 13 are separated prior to the forming of the sealing resin 17. The resin sealing process in which the sealing resin 17 is formed, may be performed by any known method and, for example, the lead frame 20 and the heat spreader 14 in the state shown in FIG. 11 are placed in a mold having a cavity of predetermined shape and a resin is filled in the cavity.

When the resin sealing process is completed and the sealing resin 17 is formed, the semiconductor chip 12, the heat spreader 14, and the wires 15 are embedded and protected in the sealing resin 17 and a part of the support bar 11 and the lead 13 is extended outside the sealing resin 17. In practice, each of the leads 13 is exposed externally of the sealing resin 17 from a portion located a little in front of the position of the tie bar 22. Likewise, a corresponding portion of the support bars 11 is also exposed externally of the sealing resin 17.

When the sealing resin 17 is formed as mentioned above, the support bars 11 and the leads 13 are cut from the cradle 21 using a cutting mold (not shown) and the tie bars 22 are removed. In this manner, the support bars 11 and the leads 13 are electrically disconnected or separated and the heat spreader 14, which is connected to each of the support bars 11 is also insulated with respect to each of the leads 13. Moreover, the exposed portion (i.e., the outer lead portion 13b) of the lead 13 is formed into a gullwing shape when the above-mentioned separating process is performed. By carrying out each of the above-explained processes, the semiconductor device 10 shown in FIG. 3 according to the present invention may be produced.

Note that in the above separating process, the step, in which the support bars 11 and the leads 13 are cut from the cradle 21 and the tie bars 22 are removed, is performed in the conventional method for producing the semiconductor device and is not provided especially for the present invention.

Also, although the present invention has been described using a case in which the QFP type semiconductor device 10 is produced, it is possible to apply the present invention to other semiconductor devices having a packaged configuration.

Moreover, although different materials are used for the heat spreader 14 and the lead frame 20 in the above embodiment, the heat spreader 14 may be formed using the same material as that used for the lead frame 20. In this manner, it is possible to process the heat spreader 14 utilizing the processing device used for processing the lead frame 20, and hence the efficiency of the process may be improved. Further, since the characteristic of the heat spreader 14 and that of the lead frame 20 may become equal when the same material is used for both, it is not necessary to take into account the effect of, for instance, the difference in thermal expansion. Thus, design for the heat spreader 14 and the lead frame 20 may be simplified.

In addition, although the heat spreader 14 is separated from the leads 13 by deforming the support bars 11 in the above embodiment, it is possible to provide a portion, which corresponds to the support bars 11, with the heat spreader 14 so that the heat spreader 14 may be separated from the leads 13 by deforming the above portion(s) of the heat spreader 14.

The above method for producing the semiconductor device according to the embodiment of the present invention is characterized by the fact that the heat spreader 14 is attached to the lead frame 20 without any space present between them before the wire-bonding process and the heat spreader 14 is separated from the lead frame 20 so as to insulate the heat spreader with respect to each of the leads 13 after the wire-bonding process.

Thus, it is necessary to deform the support bars 11 (or the heat spreader 14) so as to separate the heat spreader 14 from each of the leads 13 after providing the wires 15 between the pads 18 and the corresponding leads 13. At this stage, therefore, it is preferable to carry out the deformation process of the support bars 11 (or the heat spreader 14) as smoothly as possible so that no damage is caused to the each of the wires 15.

Next, a deformation part which may be provided with the support bar 11 or the heat spreader 14 according to the present invention will be described with reference to FIGS. 12 through 15.

Figure 12:
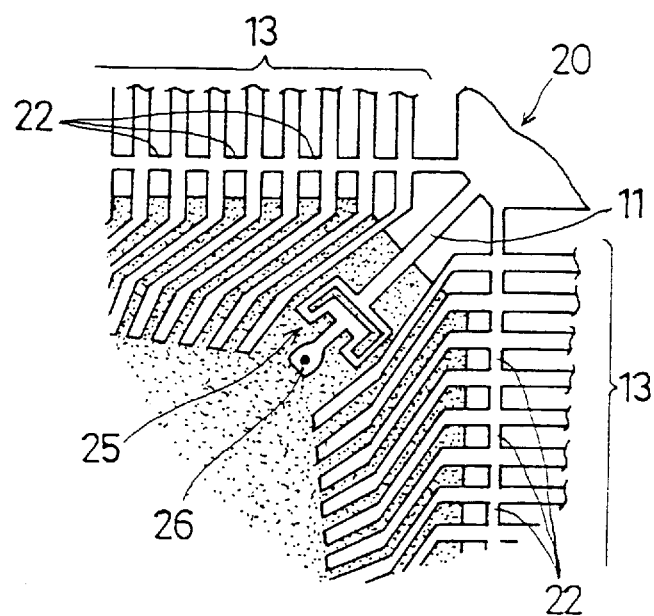
FIG. 12 is a diagram for explaining a deformation part which may be formed with a support bar according to an embodiment of the present invention.
Figure 13A:
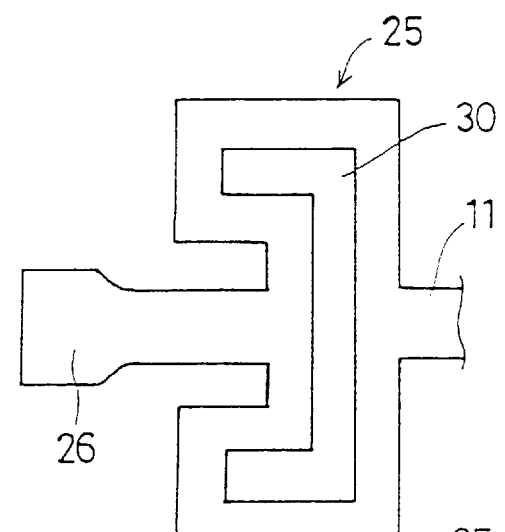
FIG. 13A is a diagram showing a plan view of the deformation part formed with the support bar in a non-deformed state.
Figure 13B:
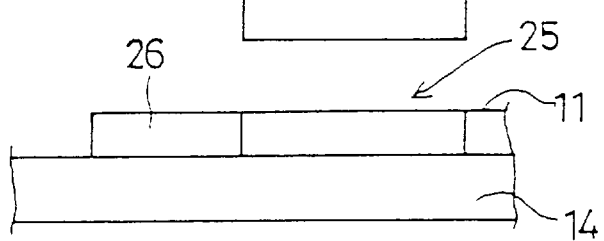
FIG. 13B is a diagram showing a cross-sectional view of the deformation part shown in FIG. 13A.
Figure 14A:
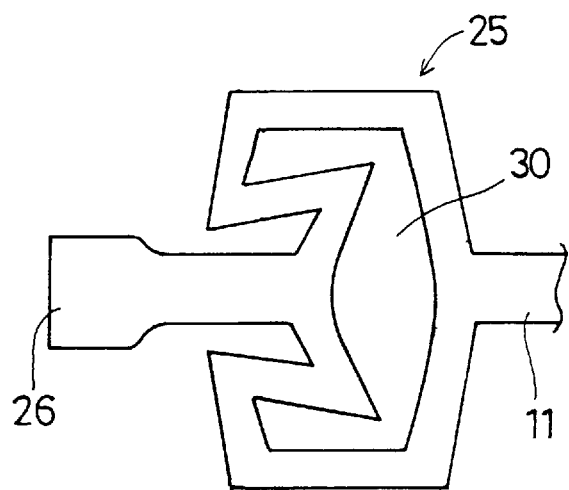
FIG. 14A is a diagram showing a plan view of the deformation part formed with the support bar in a deformed state.
Figure 14B:
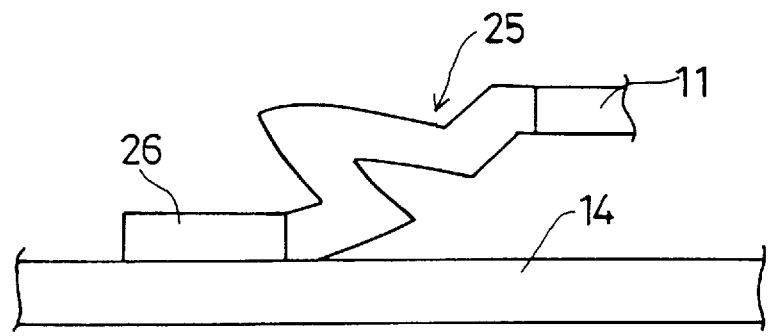
FIG. 14B is a diagram showing a cross-sectional view of the deformation part shown in FIG. 14A.

FIG. 12 is a diagram for explaining a deformation part which may be formed with the support bar 11. FIG. 13A is a diagram showing a plan view of the deformation part 25 formed with the support bar 11 before it is deformed and FIG. 13B is a diagram showing a cross-sectional view of the deformation part 25 shown in FIG. 13A. FIG. 14A is a diagram showing a plan view of the deformation part 25 formed with the support bar 11 after it is deformed and FIG. 14B is a diagram showing a cross-sectional view of the deformation part 25 shown in FIG. 14A. Also, FIG. 15 is a diagram for explaining a deformation part 27 which may be formed with the heat spreader 14.

As shown in FIG. 12, the deformation part 25 is provided in the vicinity of a bonding portion 23 of the support bar 11. The deformation part 25 has a structure in which a groove portion 30 is formed in a part of the support bar 11 as shown in FIG. 13A in a magnified scale. The groove portion 30 may be integrally formed when the leads 13 and the support bars 11 are formed in the lead frame 20. Thus, the manufacturing process of the semiconductor device is not complicated by the formation of the groove portion 30.

When the groove portion 30 is formed and the deformation part 25 is provided with the support bar 11, the width of the support bar 11 in the deformation part becomes narrower compared with the other portions of the support bar 11 and it is relatively easy to deform the portion 25. Thus, when the support bar 11 is deformed using the deformation tool 24 in the separating process, the deformation part 25 may be deformed as shown in FIGS. 14A and 14B, and hence the deformation of the support bar 11 may be carried out easily. Also, in this manner, the electrical disconnection or separation of the heat spreader 14 and the leads 13 may be properly performed.

Figure 15:
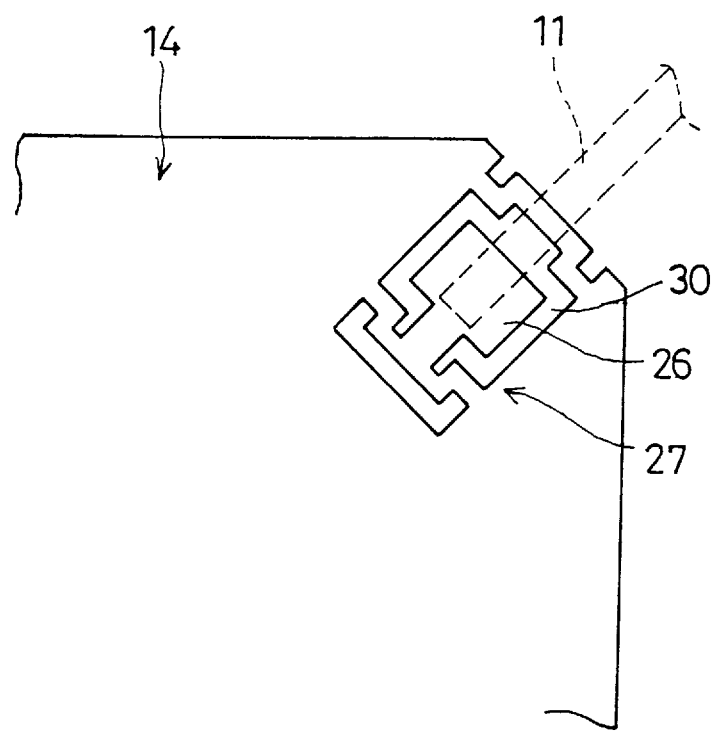
FIG. 15 is a diagram for explaining a deformation part which may be formed with a heat spreader according to an embodiment of the present invention.

In addition, as mentioned above, the deformation part may be formed in the heat spreader 14 according to the present invention as shown in FIG. 15. In FIG. 15 a groove portion $30_1$ is formed in the heat spreader 14 so as to provide a deformation part 27. In this configuration, the deformation of the heat spreader 14 may be readily performed in the separating process, and hence the electrical disconnection of the heat spreader 14 and the leads 13 may be properly carried out.

The present invention is not limited to these embodiments, and variations and modifications may be made without departing from the scope of the present invention.

What is claimed is:

1. A method for producing a semiconductor device comprising:
   a) an attaching process in which a flat-plate member is positioned on a flat-shape lead frame provided with a plurality of leads and a plurality of support bars so that said flat-plate member contacts at least said plurality of leads, and said flat-plate member is attached to said plurality of support bars;
   b) an element mounting process in which a semiconductor element is mounted on said flat-plate member attached to said plurality of support bars of said flat-shape lead frame;
   c) a wire-bonding process in which a wire is bonded between each of said plurality of leads and said semiconductor element; and
   d) a separating process, performed after completion of said wire-bonding process, in which said plurality of support bars are deformed so as to separate said flat-plate member and said plurality of leads and electrically separate said flat-plate member from said plurality of leads.

2. The method for producing a semiconductor device as claimed in claim 1, comprising providing said flat-plate member as a thermally conductive heat dissipating plate.

3. The method for producing a semiconductor device as claimed in claim 1, comprising making said flat-plate member and said flat-shape lead frame from substantially identical materials.

4. The method for producing a semiconductor device as claimed in claim 1, comprising forming a deformation part with said plurality of support bars prior to said attaching process and enabling a deformation operation of said plurality of support bars which is carried out in said separating process.

5. The method for producing a semiconductor device as claimed in claim 4, comprising forming a groove portion with said plurality of support bars so as to provide said deformation part.

6. The method for producing a semiconductor device as claimed in claim 1, comprising using laser welding to provide an attachment of said flat-plate member to said plurality of support bars in said attaching process.

7. A method for producing a semiconductor device comprising:
   a) an attaching process in which a flat-plate member is positioned on a flat-shape lead frame provided with a plurality of leads and a plurality of support bars so that said flat-plate member contacts at least said plurality of leads, and said flat-plate member is attached to said plurality of support bars;

b) an element mounting process in which a semiconductor element is mounted on said flat-plate member attached to said plurality of support bars of said flat-shape lead frame;

c) a wire-bonding process in which a wire is bonded between each of said plurality of leads and said semiconductor element; and d) a separating process, performed after completion of said wire-bonding process, in which said flat-plate member is deformed so as to separate said flat-plate member and said plurality of leads and electrically separate said flat-plate member from said plurality of leads.

8. The method for producing a semiconductor device as claimed in claim 7, comprising providing said flat-plate member as a thermally conductive heat dissipating plate.

9. The method for producing a semiconductor device as claimed in claim 7, comprising making said flat-plate member and said flat-shape lead frame from substantially identical materials.

10. The method for producing a semiconductor device as claimed in claim 7, comprising forming at least one deformation part with said flat-plate member prior to said attaching process and enabling a deformation operation of said flat-plate member which is carried out in said separating process.

11. The method for producing a semiconductor device as claimed in claim 10, comprising forming at least one groove portion with said flat-plate member so as to provide said at least one deformation part.

12. The method for producing a semiconductor device as claimed in claim 7, comprising using laser welding to provide an attachment of said flat-plate member to said plurality of support bars in said attaching process.

* * * * *